United States Patent
Yang et al.

(10) Patent No.: US 8,449,730 B2
(45) Date of Patent: May 28, 2013

(54) BUFFER LAYERS FOR L10 THIN FILM PERPENDICULAR MEDIA

(75) Inventors: En Yang, Pittsburgh, PA (US); David E. Laughlin, Pittsburgh, PA (US); Jian-Gang Zhu, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 451 days.

(21) Appl. No.: 12/505,921

(22) Filed: Jul. 20, 2009

(65) Prior Publication Data

US 2011/0011733 A1    Jan. 20, 2011

(51) Int. Cl.
C23C 14/00 (2006.01)
C23C 14/32 (2006.01)

(52) U.S. Cl.
USPC ............. 204/192.1; 204/192.15; 427/130

(58) Field of Classification Search
USPC ................ 427/130; 204/192.1, 192.15
See application file for complete search history.

(56) References Cited

U.S. PATENT DOCUMENTS

| | | | |
|---|---|---|---|
| 6,480,411 B1 * | 11/2002 | Koganei ................... | 365/158 |
| 6,537,638 B2 * | 3/2003 | Do et al. ................... | 428/831 |
| 7,167,342 B2 | 1/2007 | Yasui et al. | |
| 7,229,709 B2 | 6/2007 | Tsuchiya et al. | |
| 2004/0161638 A1 * | 8/2004 | Maeda et al. ............ | 428/694 T |
| 2004/0185307 A1 | 9/2004 | Oikawa et al. | |
| 2006/0153976 A1 | 7/2006 | Ito et al. | |
| 2007/0217072 A1 | 9/2007 | Oikawa | |
| 2007/0230233 A1 | 10/2007 | Takahashi et al. | |

FOREIGN PATENT DOCUMENTS

| | | |
|---|---|---|
| EP | 1538604 A2 | 6/2005 |
| EP | 1542209 A1 | 6/2005 |
| WO | WO 2006/025799 A1 | 3/2006 |
| WO | WO 2008/030199 A1 | 3/2008 |

OTHER PUBLICATIONS

Xu et al. (FePt Nanocluster Films for High Density Magnetic Recording, Journal of Nonoscience and Nanotechnology vol. 7, 206-224, 2007).*
Hsu et al. (Effect of Ag Segregation on Reversal Behavior of (FePt)77Ag23 Alloy Thin Films, IEEE Transaction on Magnetics, vol. 43, No. 6, Jun. 2007).*
Effects of Ag buffer layer on the microstructure and magnetic properties of nanocomposite FePt/Ag multilayer films S. C. Chen, P. C. Kuo, C. Y. Chou, and A. C. Sun, J. Appl. Phys. 97, 10N107 (2005), DOI:10.1063/1.1850386.*

(Continued)

Primary Examiner — Keith Hendricks
Assistant Examiner — Ibrahime A Abraham
(74) Attorney, Agent, or Firm — K&L Gates LLP

(57) ABSTRACT

A process of fabricating a perpendicular magnetic recording medium. In one embodiment, the process may comprise forming a metallic buffer layer with a (002) texture on an underlayer using a deposition process performed at a temperature below 30° C. The underlayer may have a crystalline (001) texture. The process may further comprise forming a perpendicular magnetic recording layer on top of the metallic buffer layer using a deposition process performed at a temperature above 350° C. The magnetic recording layer may comprise a magnetic material with a $L1_0$ crystalline structure and with a c-axis perpendicular to a plane of the perpendicular magnetic recording layer. The process may further comprise removing metal of the metallic buffer layer from a top surface of the perpendicular magnetic recording layer that moved to the top surface of the perpendicular magnetic recording layer during the forming of the perpendicular magnetic recording layer.

15 Claims, 8 Drawing Sheets

OTHER PUBLICATIONS

A. C. Sun J.-H. Hsu P. C. Kuo and H. L. Huang "Microstructural and magnetic studies of", J. Magn. Magn. Mater., vol. 320, pp. 3071-3074, 2008.*

Yang et al., "L10 FePt-oxide columnar perpendicular media with high coercivity and small grain size," Jour. of Applied Physics 104,023904 (2008).

* cited by examiner

BUFFER LAYERS FOR L10 THIN FILM PERPENDICULAR MEDIA

BACKGROUND

In conventional hard disk drive (HDD) systems, the recording media is coated with a ferromagnetic film that contains tiny magnetic grains. This ferromagnetic film acts as the recording layer for the media. In longitudinal recording media, the magnetization easy direction of the grains of the recording layer is in the plane of the film. In perpendicular recording media, the magnetization easy direction of the grains of the recording layer is perpendicular to the plane of the film. Perpendicular recording media offers the advantage of increased storage density over longitudinal recording media. Perpendicular recording is predicted to allow storage densities of up to around one Tbit/sq. inch (1000 Gbit/sq. inch) or higher.

The ferromagnetic material iron platinum (FePt) is a material that is of great interest in the field of magnetic data storage, especially as the recording layer in hard disk drive applications, because of its relatively high magnetocrystalline anisotropy. FePt is an example of crystalline material with the $L1_0$ structure. An ideal $L1_0$ single crystal is based on a face centered cubic material (fcc) but consists of an equal number of two kinds of atoms, in this case Fe and Pt. Along the atomic ordering direction, or c-axis, each atomic plane consists of one kind of atom and the adjacent planes consist of the other kind of atom. Usually, the distance between the adjacent atomic planes along the ordering direction [001] is slightly shorter than the other two orthogonal <100> directions.

When used as a thin film perpendicular media, the c-axis of the FePt $L1_0$ is grown perpendicular to the plane of the film. If the FePt thin film is deposited at room temperature, however, it is usually not sufficiently atomically ordered. That is, if deposited at room temperature, a large number of the Fe and Pt atoms do not assume the $L1_0$ structure. Sufficient ordering for the $L1_0$ structure can usually only be achieved when the FePt thin film is deposited at an elevated temperature (about 550° C. or above) or when a high temperature post annealing process is used. Because aluminum (Al) is often used in the hard disk substrate, such high fabrication temperatures often result in damage to the recording media.

SUMMARY

In one general aspect, the present invention is directed to a process for fabricating a magnetic recording medium, and in particular, a perpendicular magnetic recording medium. In various embodiments, the process comprises the step of forming a metallic buffer layer on an underlayer. The metallic buffer layer preferably comprises a (002) crystalline texture and the underlayer preferably comprises a (001) texture. The metallic buffer layer, which comprises a metal such as silver (Ag) or gold (Au), is formed using a deposition process performed at a temperature less than 100° C., preferably less than 50° C., and preferably at around ambient temperature (e.g., 20° C. to 25° C.). The underlayer may comprise MgO and/or RuAl.

After forming the metallic buffer layer, a magnetic recording layer is formed on top of the metallic buffer layer. The magnetic recording layer preferably comprises FePt with a $L1_0$ crystalline structure, although other materials such as FePd, CoPt, or MnAl may also be used in the magnetic recording layer. Also, the magnetic recording layer preferably is a perpendicular magnetic recording layer, such that the c-axes of the $L1_0$ crystals are perpendicular to the plane of the magnetic recording layer. Preferably, the magnetic recording layer is deposited using a deposition process, such as sputtering, performed at an elevated temperature (i.e., above ambient temperature), such as 350° C. or greater, and preferably around 400° C. The inventors have found that when the magnetic recording layer is deposited using such an elevated temperature, metal from the metallic buffer layer "floats" to the top of the magnetic recording layer (i.e., metallic atoms of the magnetic buffer layer transport up through the growing FePt or other $L1_0$ material aiding in the atomic ordering process). The process then involves removing the metallic buffer layer atoms, such as by cleaning the metal atoms from the top of the magnetic recording layer that transported up to the top of the magnetic recording layer during deposition of the magnetic recording layer.

It is believed by the inventors that the "floating" of the metal of the metallic buffer layer to the top of the magnetic recording layer during deposition of the magnetic recording layer results in enhanced atomic ordering of the crystals of the magnetic recording layer, as well as improving the crystalline texture, or orientation, of the crystals of the magnetic recording layer.

Other embodiments of the process are described below, including embodiments that comprise additional buffer layers that comprise oxide. In addition, various embodiments of the present invention are directed to film stacks used in fabricating the magnetic recording medium, including intermediate film stacks that are used at various stages throughout the fabrication process.

FIGURES

Various embodiments of the present invention are described herein by way of example in conjunction with the following figures, wherein.

Figure 9:
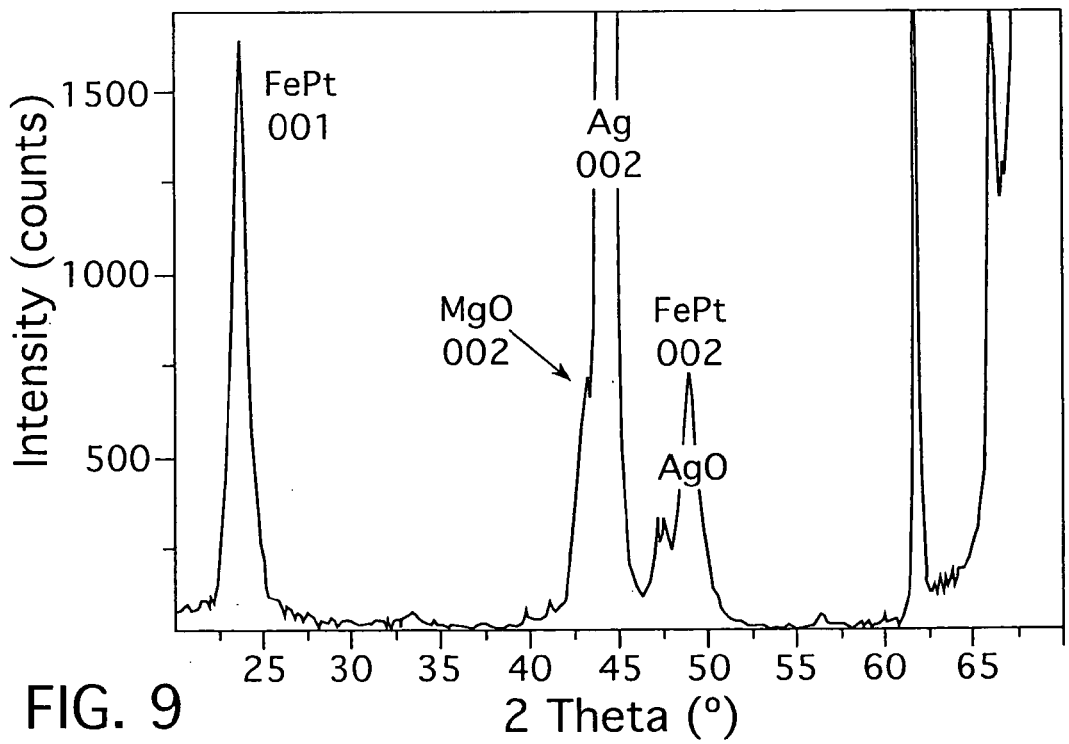
Figure 10:
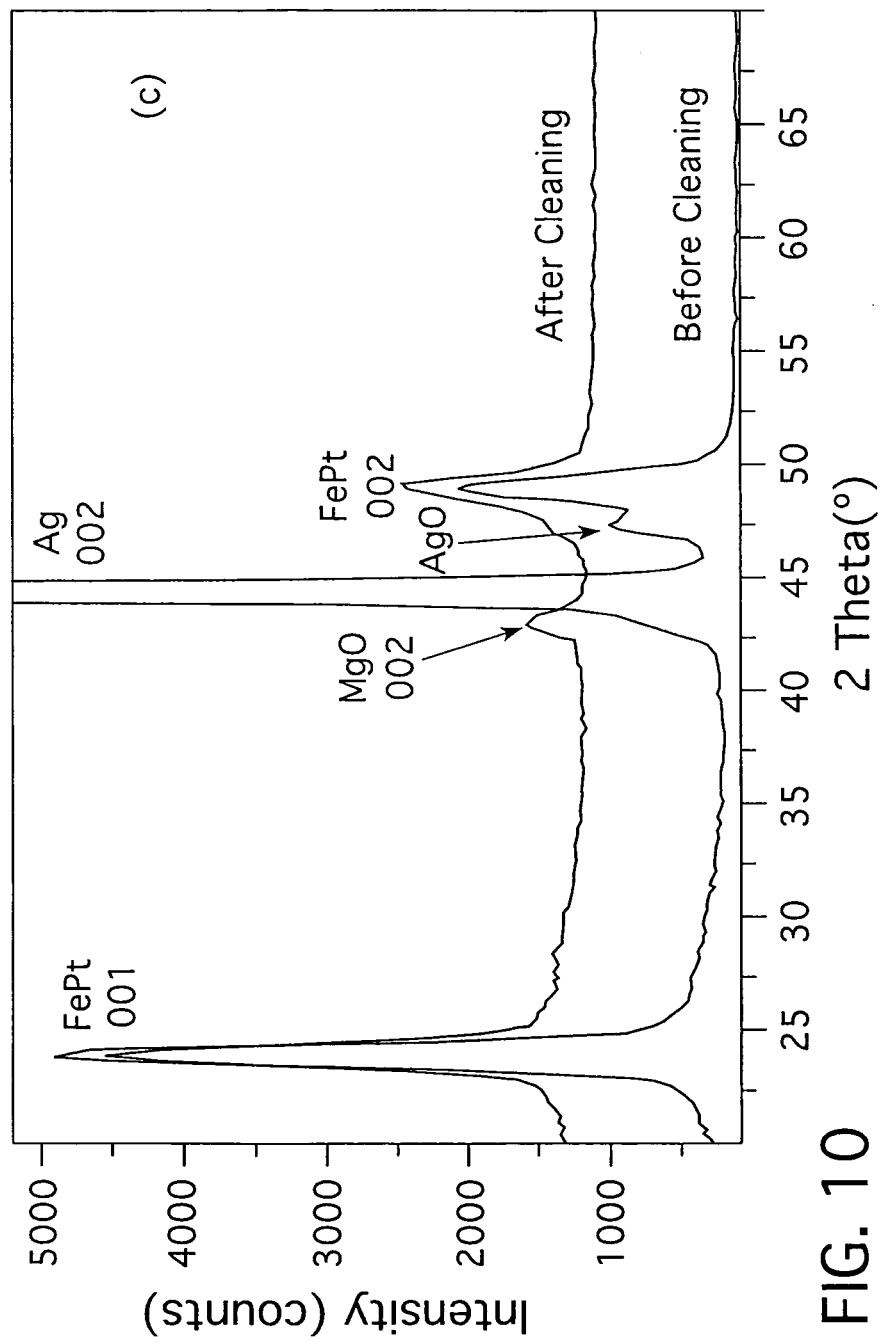
Figure 11:
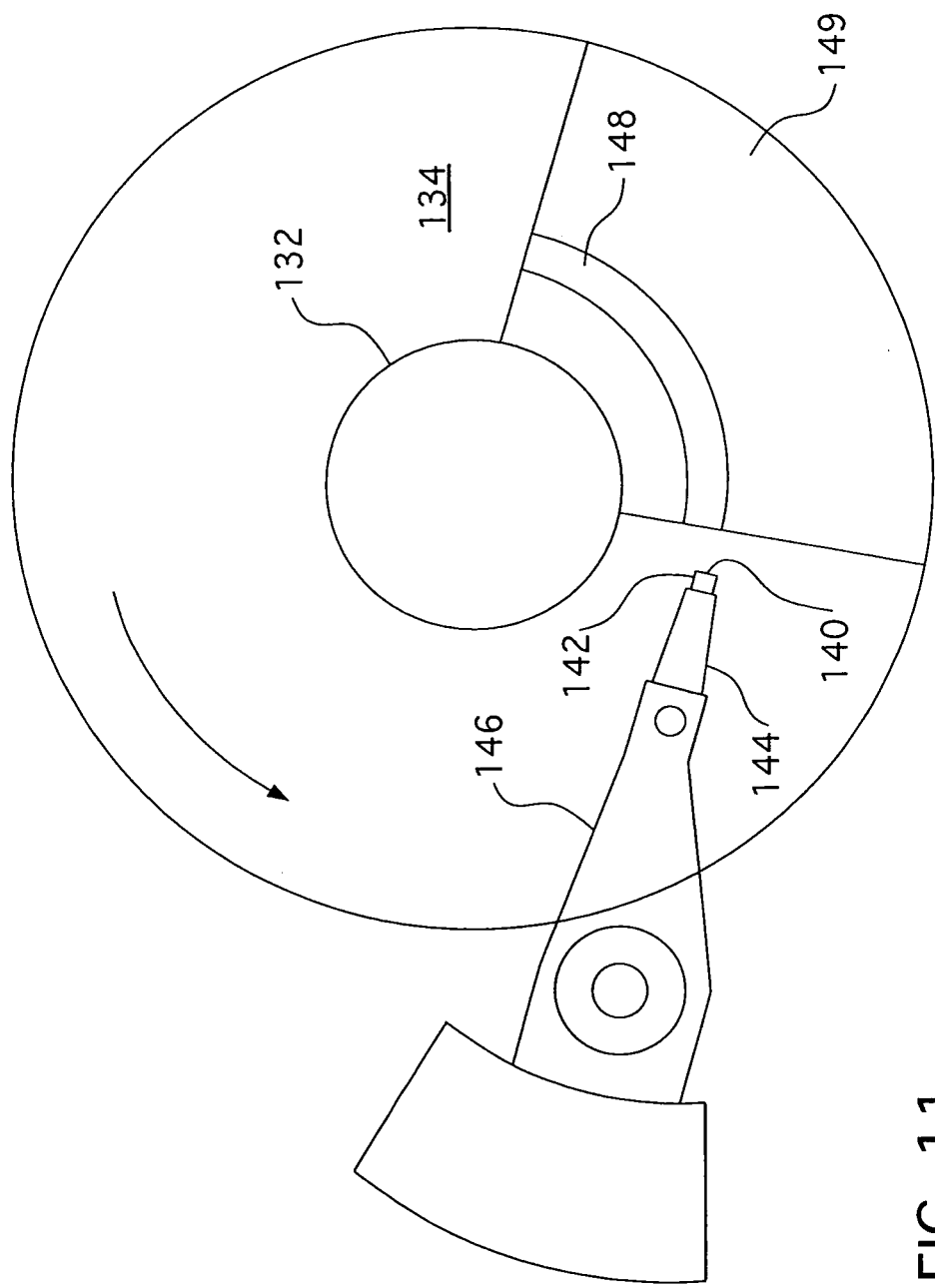

FIGS. 3, 4A-B, 5, and 6 are diagrams illustrating film stacks according to other embodiments of the present invention;

FIGS. 7-10 are graphs of x-ray diffraction data for experiments involving various embodiments of the present invention; and FIG. 11 is a diagram of a disk drive system according to various embodiments of the present invention.

DETAILED DESCRIPTION

Figure 1:
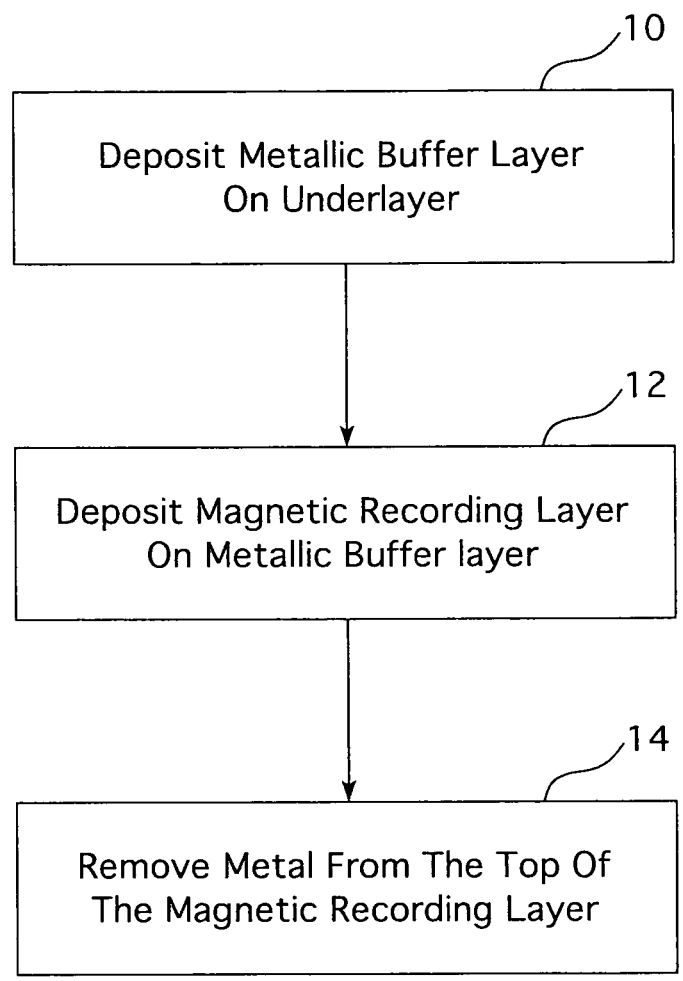
FIG. 1 is a diagram illustrating a process of fabricating a magnetic recording medium according to various embodiments of the present invention.
Figure 2A:
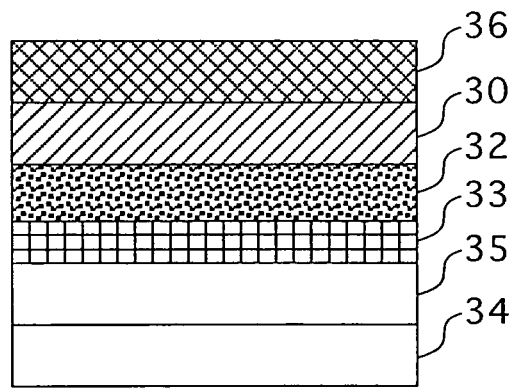
FIGS. 2A to 2C are diagrams illustrating film stacks used in the process of FIG. 1 according to various embodiments of the present invention.
Figure 2B:
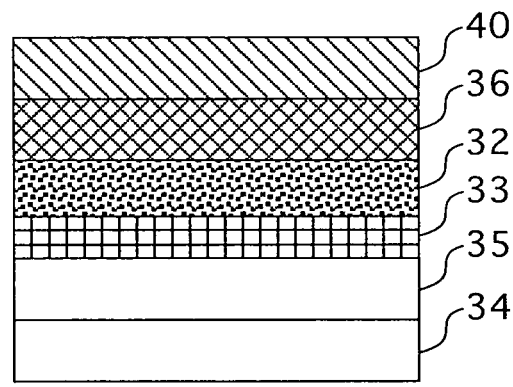
Figure 2C:
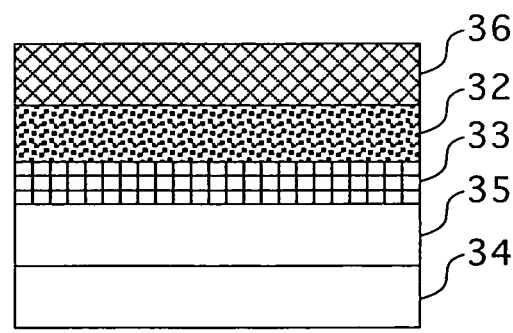

FIG. 1 is a diagram of a process of fabricating a magnetic recording medium according to various embodiments of the present invention. A magnetic recording medium fabricated according to the process shown in FIG. 1 may be used, for example, as a magnetic data recording layer of a platter or disc of a magnetic hard disk drive. Diagrams of the magnetic recording film stacks at various stages in the fabrication process are shown in FIGS. 2A to 2C according to various embodiments.

The process illustrated in FIG. 1 does not necessarily represent the complete process for forming the magnetic recording layer. Other, conventional steps may also be used in the process. The process illustrated on FIG. 1 focuses on the important steps relevant to the embodiments of the invention described herein. The process illustrated in FIG. 1 starts at step 10 with the deposition of a metallic buffer layer 30 on an underlayer 32 (see FIG. 2A). In various embodiments, the underlayer 32 may be formed on a seed layer 33, which may be formed on a heat sinking layer 35, which may be formed on a substrate 34. The atoms of the underlayer 32 preferably have a crystalline structure with a (001) texture, i.e., a crystal structure with a (001) plane parallel to the film plane. The underlayer 32 preferably comprises a non-magnetic material, such as MgO or RuAl. The underlayer 32 may have a thickness of about one (1) nm to twenty (20) nm.

The substrate 34 may comprise a nonmagnetic material, such as an aluminum alloy with NiP plating, strengthened glass, crystallized glass, a silicon wafer with an oxidized surface, or a fused silica substrate. In addition, a plastic resin substrate may be used. The heat sinking layer 35 preferably comprises a material with high thermal conductivity, such as a Au, Cu, or diamond-like carbon (DLC). The seed layer 33 may comprise a (001) texture material. For example, the seed layer may comprise Cr and/or alloys of Cr with a A2 structure (BCC), such as CrRu, CrW, CrV, CrTi, or CrMo. Also, the seed layer may comprise a B2 structure, such as RuAl or NiAl. In addition, the seed layer 33 may comprise alloys with a A1 (FCC) structure, such as Ag, Au, Pt, or Pd. Additionally, the seed layer may also comprise Fe (either BCC or FCC). The seed layer may have a thickness of 1 nm to 20 nm, for example.

The metallic buffer layer 30 may comprise a metal, such as copper (Cu), silver (Ag), or gold (Au). The metallic buffer layer preferably possesses a (002) crystalline texture. The metallic buffer layer 30 may be formed on the underlayer 32 using a sputtering fabrication process, such as RF sputtering, or some other film deposition process. Preferably, the deposition of the metallic buffer layer 30 is conducted at a relatively low temperature. For example, the metallic buffer layer 30 may be formed on the underlayer 32 using a processing temperature of less than 100° C., preferably less than 50° C., more preferably less than 30° C., and yet more preferably at around ambient temperature, such as between about 20° C. and 25° C. The metallic buffer layer 30 may have a thickness of about one (1) nm to twenty (20) nm.

Next, at step 12, the magnetic recording layer 36 is formed on the metallic buffer layer 30. The magnetic recording layer 36 preferably comprises iron platinum (FePt) with a $L1_0$ crystalline structure and a (001) texture. In addition, preferably the a magnetic hard axis (c-axis of the FePt) of the crystal structure is perpendicular to the plane of the magnetic recording layer 36 to provide a perpendicular magnetic recording medium. In addition, the magnetic recording layer 36 preferably is granular in nature with near-uniform sized grains and with well-defined grain boundaries. For example, the FePt grains may have a diameter of about 10 nm. The grain boundaries may comprise an oxide, such as $SiO_x$, $TiO_x$, or $CrO_x$. Techniques for forming such FePt grains with oxide grain boundaries are known in the art. See, for example, En Yang and David E. Laughlin, "$L1_0$ FePt-oxide columnar perpendicular media with high coercivity and small grain size," Journal of Applied Physics 104, 023904 (2008), which is incorporated herein by reference in its entirety. The magnetic recording layer may have a thickness of about one (1) nm to twenty (20) nm. In other embodiments, the magnetic recording layer comprises FePd, CoPt, or MnAl, preferably with a $L1_0$ crystalline structure.

The magnetic recording layer 36 (e.g., FePt or FePt plus oxide for the grain boundaries) may be deposited on the metallic buffer layer 30 using a sputtering process, such as RF sputtering, or some other film deposition technique. Preferably, the processing temperature for depositing the magnetic recording layer 36 is greater than the processing temperature for forming the metallic buffer layer 30. For example, the processing temperature for forming the magnetic recording layer 36 may be 300° C. to 500° C., such as about 400° C.

In various embodiments where RF sputtering is used to deposit a FePt—oxide magnetic recording layer 36, the base pressure may be about $5 \times 10^{-7}$ Ton and the argon pressure may vary between 10 to 65 mTorr. As mentioned above, the FePt—oxide magnetic recording layer 36 layer is deposited at an elevated temperature (such as 400° C.) by heating the stack during deposition. The FePt-oxide can be fabricated by either co-sputtering with separate FePt and oxide targets, or sputtering with a FePt-oxide composite single target. An alternative method is to deposit FePt/oxide multilayers by alternating the sputtering of an $Fe_{55}Pt_{45}$ alloy target and a $SiO_2$ target. The FePt may be deposited at a deposition rate lower than 3.8 nm/min.

When using a Ag metallic buffer layer 30, experimental study by the inventors shows that during deposition of the magnetic recording layer 36 at such elevated temperatures, some of the Ag of the Ag metallic buffer layer 30 "floats" to the top of the magnetic recording layer 36 to arrive at the structure shown in FIG. 2B, where an upper metal layer 40 of the metal (e.g., Ag) of the metallic buffer layer 30 forms on top of an upper surface of the magnetic recording layer 36. That is, metallic atoms of the metallic buffer layer 30 transport up through the $L1_0$ material of the magnetic recording layer 36. The inventors believe that the "floating" process of the Ag buffer layer 30 during the deposition of the magnetic recording layer 36 enhances the atomic ordering of the FePt $L1_0$ structure of the magnetic recording layer 36, as well as improves its crystalline (001) texture, or [001] orientation.

At step 14, the upper metal layer 40 that has floated to the top of the magnetic recording layer 36 may be removed, resulting in the structure shown in FIG. 2C. In various embodiments, the upper metal layer 40 may be removed by washing with acetone or some other suitable cleaning or removing agent or process (such as mechanical brushing). Traces of the metallic buffer layer 30 may be found in the final film stack post-processing. For example, if the FePt $L1_0$ magnetic recording layer 36 is granular in nature with oxide grain boundaries, metal from the metallic buffer layer 30 (e.g., Ag) may be found inside the grain boundaries after the magnetic recoding layer 36 deposition process.

In various embodiments, additional layers may be formed on the magnetic recording layer 36 subsequent to removal of the metal at step 14. For example, in various embodiments, a protective overcoat (not shown) may be formed on the magnetic recording layer 36 subsequent to removal of the metal at step 14.

Figure 3:
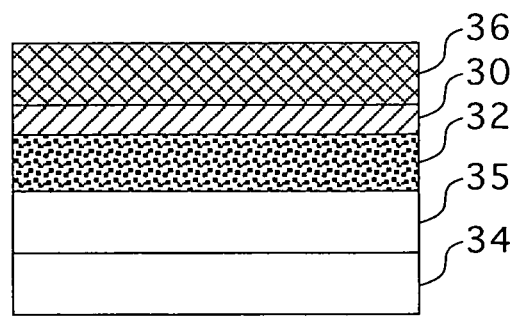

Depending on the temperature and time duration of the deposition of the magnetic recording layer 36, not all of the metal of the metallic buffer layer 30 may "float" to the top of the magnetic recording layer 36. Accordingly, in some embodiments, after deposition of the magnetic recording layer 36, there may still be a thin, residual Ag metallic buffer layer 30 below the magnetic recording layer 36, as shown in FIG. 3, after cleaning of the upper metal layer 40 formed during deposition of the magnetic recording layer 36. Some Ag may also be dispersed in the magnetic film or in the oxide of the magnetic film.

Figure 4A:
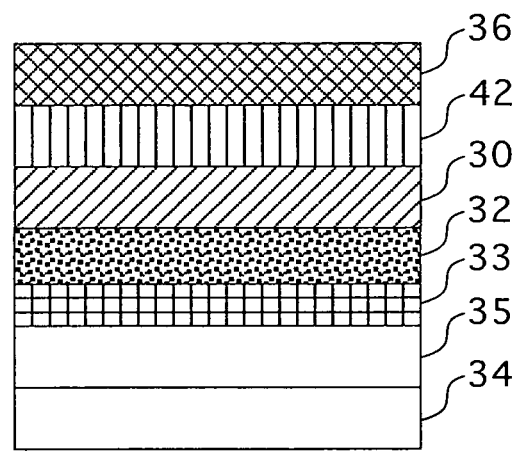
Figure 4B:
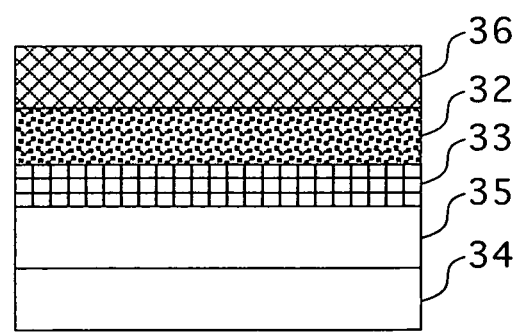

If the magnetic recording layer 36 contains both the magnetic material (e.g., FePt) and oxide for the grain boundaries, the "floating" process of the metallic buffer layer 30 during the deposition of the magnetic recording layer 36 may cause degradation of the granular structure of the magnetic recording layer 36. In one embodiment, to reduce the degradation of the granular structure of the magnetic recording layer 36, and to preserve the columnar granular structure, an additional oxide buffer layer 42 may be introduced on top of the metallic buffer layer 30, as shown in FIGS. 4A and 4B. FIG. 4A shows the stack prior to the metal of the metallic buffer layer 30 floating to the top of the magnetic recording layer 36 and FIG. 4B shows the stack after removal of the metal upper metal layer 40 formed during deposition of the magnetic recording layer 36 from the top surface of the magnetic recording layer 36.

The oxide buffer layer 42 comprises an oxide, such as $SiO_x$, $TiO_x$, or $CrO_x$. Additionally, in various embodiments, the oxide buffer layer 42 may comprise the same metal used for the metallic buffer layer 30 (e.g., Ag). After the deposition of the magnetic recording layer 36, the Ag of the metallic buffer layer 30 (and the oxide buffer layer 42 when the oxide buffer layer 42 comprises Ag) "floats" to the top of the stack (e.g., to the top of the magnetic recording layer 36). Experiments show that the oxide of the oxide buffer layer 42 appears to be part of the oxide grain boundaries in the magnetic recording layer 36 (for embodiments having oxide grain boundaries in the magnetic recording layer 36) after the formation of the magnetic recording layer 36. As a result, after cleaning the upper metal layer 40 (step 14 of FIG. 1), the structure shown in FIG. 2C (or FIG. 3) may be the resulting structure when using the oxide buffer layer 42. The oxide buffer layer 42 preferably has a thickness that is effective for preserving the granular structure of the magnetic recording layer 36.

Figure 5:
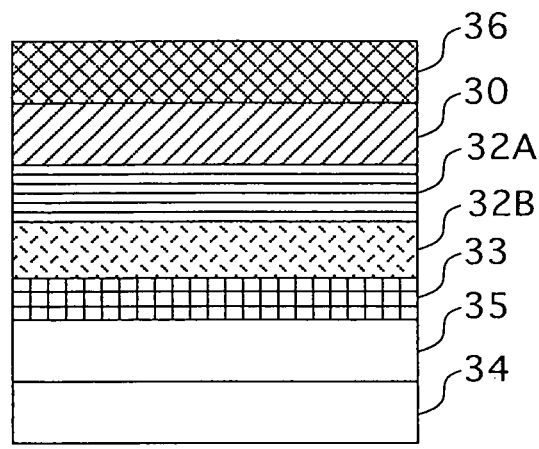

In other embodiments, the underlayer 32 may comprise multiple layers 32A-B, as shown in FIG. 5. For example, in one embodiment, the underlayer 32 may comprise a top layer 32a of MgO (001) on top of a lower layer 32b of RuAl (001). In another embodiment, the underlayer 32 may comprise a top layer 32a of RuAl (001) on top of a lower layer 32b of MgO (001). FIG. 5 shows the stack prior to the metal of the metallic buffer layer 30 "floating" to the top of the magnetic recording layers 36.

Figure 6:
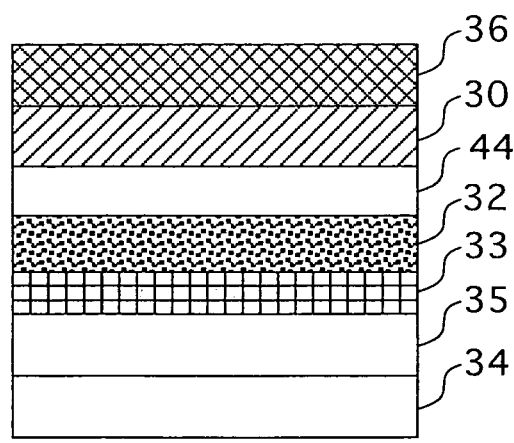

For an embodiment where the metallic buffer layer 30 comprises Au, a thin Fe layer 44 may be formed on the underlayer 32, especially when the underlayer comprises MgO, as shown in FIG. 6, because Au does not always adhere well on MgO.

Figure 7:
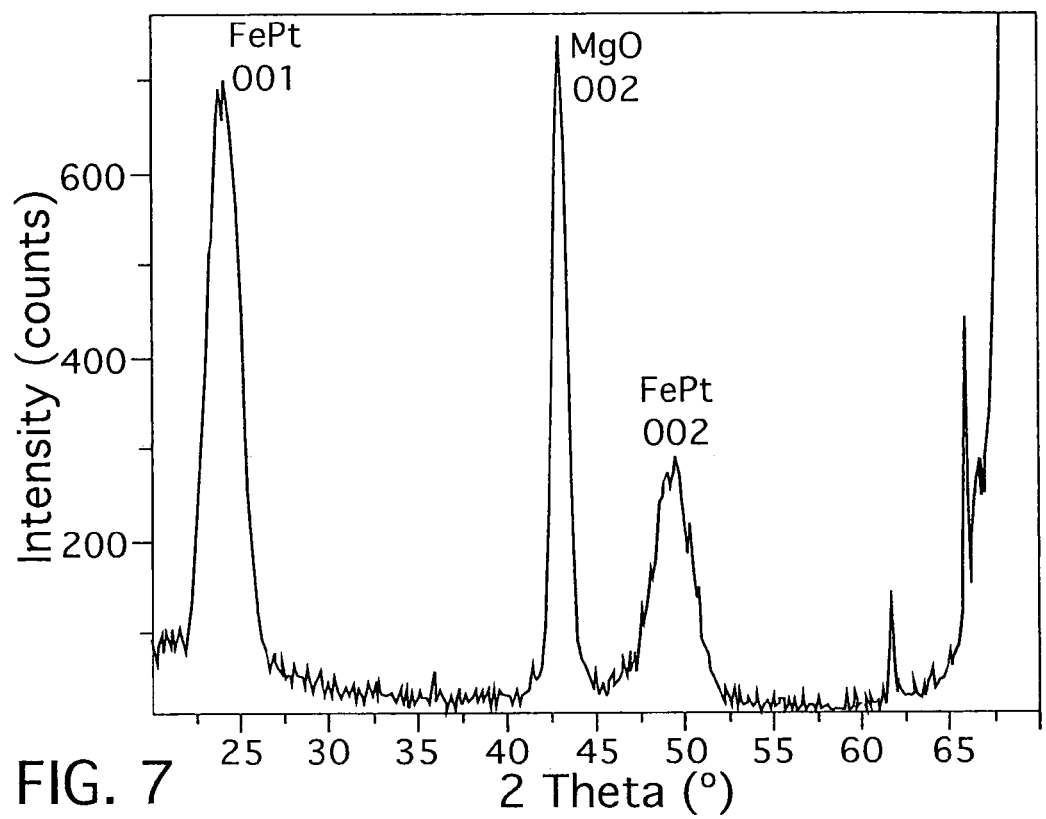
Figure 8:
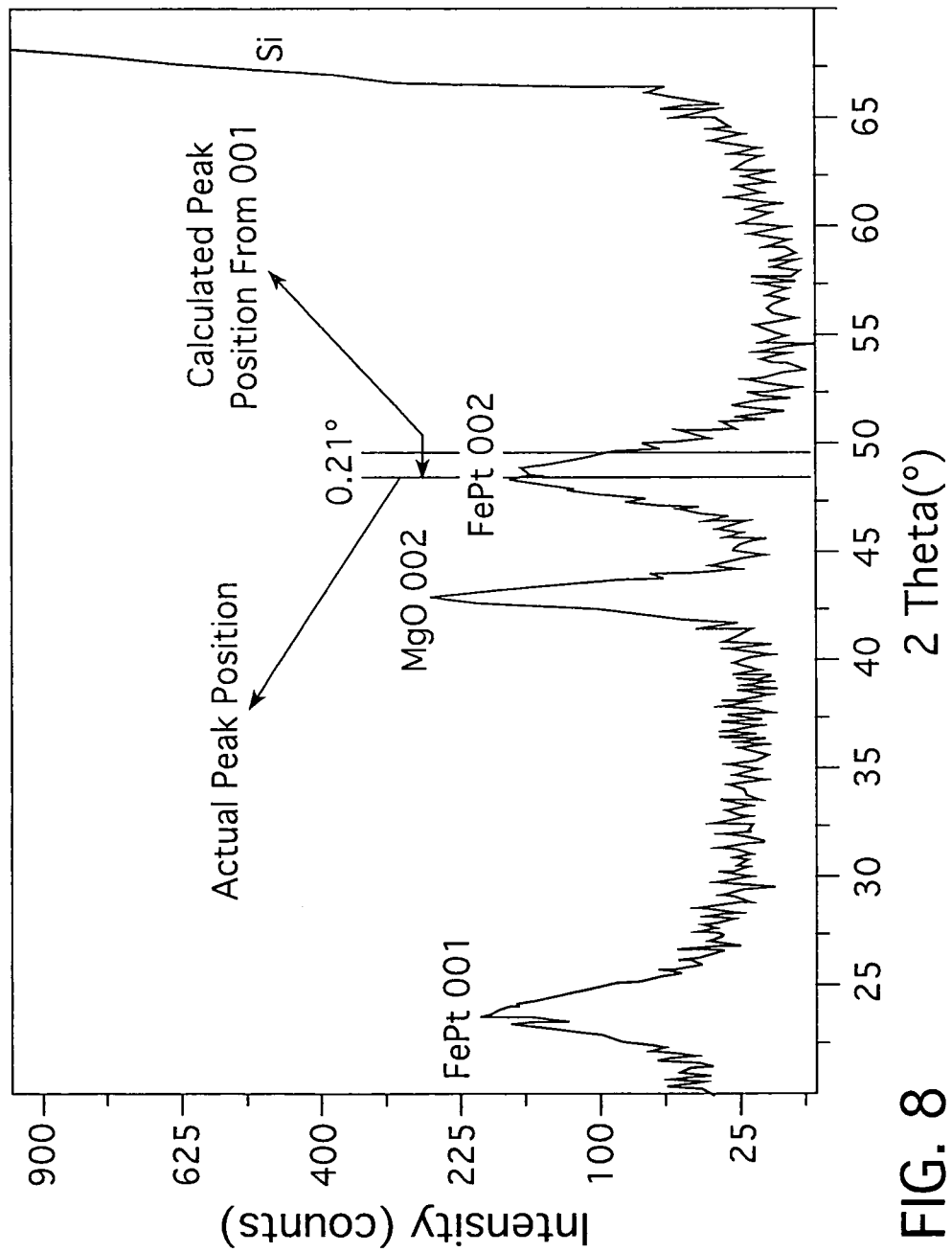

The inventors have conducted experimental studies on film stacks fabricated according to embodiments disclosed herein. FIG. 7 is a graph showing x-ray diffraction data for a magnetic recoding stack that used a 2 nm-thick Ag metallic buffer layer 30 and an 18 nm-thick MgO underlayer 32. The magnetic recoding layer 36 comprised FePt and was deposited by sputtering using a processing temperature of 400° C. and a pressure of 10 mT. The Ag metallic buffer layer 30 was formed on the MgO underlayer 32 at room temperature. FIG. 7 shows ordering of the FePt magnetic recording layer 36 by the ratio of FePt (001) peak to the (002) peak. As shown in FIG. 7, in this example, the FePt (001) peak is more than two times the (002) peak. FIG. 8 shows the x-ray data without the metallic buffer layer 30. As shown in FIG. 8, the (002) $L1_0$ peak is comparable to its (001) peak, meaning that the FePt magnetic recording layer 36 is better ordered when the metallic buffer layer 30 is used than when it is not used.

The results, however, showed that the resulting microstructure of the FePt layer may not be desirable in every case as the FePt layer was broken into very small magnetic grains. There are at least two ways to address this potential shortcoming. First, use a sufficiently high percentage of oxide in the FePt magnetic recording layer 36. Second is to use the oxide buffer layer 42 described above. FIG. 9 shows x-ray diffraction results when using a stack that used: an 18 nm-thick MgO underlayer 32, a 15 nm-thick Ag metallic buffer layer 30, a 1.2 nm-thick $SiO_2$ oxide buffer layer 42, and a FePt magnetic recording layer 36 that comprises 25% oxide ($SiO_x$). In this example, the FePt magnetic recording layer 36 was deposited by sputtering at a temperature of 400° C. and a pressure of 10 mT. The resulting FePt-oxide layer 36 showed well-preserved granular structures and no break-ups of the grains through the entire depth of the FePt layer 36; the FePt grains were essentially columnar. FIG. 9 shows that the FePt magnetic recording layer 36 also has very high order parameter and excellent (001) texture.

FIG. 10 shows x-diffraction data before and after removal of metal of the metallic buffer layer 30 from the top of the FePt magnetic recording layer 36 after deposition of the FePt magnetic recording layer 36. In the experiment for FIG. 10, the recording stack comprised: a 5 nm-thick FePt magnetic recording layer 36 with 10% SiOx; a 5 nm-thick oxide buffer layer 42 comprising Ag and 30% SiOx; a 10 nm-thick Ag metallic buffer layer; and a 10 nm-thick MgO underlay 32. FIG. 10 illustrates two important results. First is the high order parameter and excellent (001) texture of the FePt magnetic recording layer 36. Second is the near-complete removal of the Ag of the metallic and oxide buffer layers.

The embodiments of perpendicular magnetic recording media described above may be used, for example, in a magnetic disk drive system. FIG. 11 shows an exemplary disk drive system 100 according to various embodiments of the present invention. The disk drive system 100 includes a spindle 132 that supports and rotates a magnetic disk 134 having an embodiment of the perpendicular magnetic recording media described above. The spindle 132 may be rotated by a motor (not shown) that is controlled by a motor controller (not shown). A read/write head 140 may be mounted on an air-bearing slider 142 that is supported by a suspension 144 and an actuator arm 146. The disk drive system 100 may include a number of such disks, sliders, and suspensions in some embodiments, such as for a large capacity direct access storage device (DASD). The suspension 44 and the actuator arm 46 position the slider so that the read/write head 40 may be in a transducing relationship with the surface of the disk 34.

Therefore, according to various embodiments, the present invention is directed to a process of fabricating a perpendicular magnetic recording medium. The method may comprise the following steps: (i) forming a metallic buffer layer with a (002) texture on an underlayer, the underlayer having a (001) texture, wherein the forming of the metallic buffer layer comprises forming the metallic buffer layer using a deposition process performed at a temperature below 100° C., wherein the metallic buffer layer comprises a metal; (ii) after forming the metallic buffer layer, forming a perpendicular magnetic recording layer on top of the metallic buffer layer, wherein formation of the perpendicular magnetic recording layer comprises forming the magnetic recording layer using a deposition process performed at a temperature between 300° C. and 500° C., wherein the magnetic recording layer comprises a magnetic material with a $L1_0$ crystalline structure and with a c-axis perpendicular to a plane of the perpendicular magnetic recording layer; and (iii) after forming the perpendicular magnetic recording layer, removing metal of the metallic buffer layer from a top surface of the perpendicular magnetic recording layer that moved to the top surface of the perpendicular magnetic recording layer during the forming of the perpendicular magnetic recording layer.

According to various implementations, the magnetic recording layer comprises FePt. Alternatively, the magnetic recording layer may comprise FePd, CoPt, or MnAl. Also, the magnetic recording layer may comprise oxide, such bas $SiO_x$. In addition, the underlayer may comprise MgO having a (001) texture or RuAl having a (001) texture.

Additionally, the metal of the metallic buffer layer may comprise Ag, in which case, the step of removing metal from the top surface of the perpendicular magnetic recording layer comprises removing Ag of the metallic buffer layer from the top surface of the perpendicular magnetic recording layer. According to other various implementations, the method may further comprise, after forming the metallic buffer layer and prior to forming the perpendicular magnetic recording layer, forming an oxide buffer layer on top of the metallic buffer layer. The oxide buffer layer may comprise, in addition to oxide, a metal such as Ag.

In another embodiment, the metal of the metallic buffer layer may comprise Au, in which case, the step of removing metal from the top surface of the perpendicular magnetic recording layer comprises removing Au of the metallic buffer layer from the top surface of the perpendicular magnetic recording layer. In addition, the method may further comprise the step of, prior to forming the metallic buffer layer, forming a Fe layer on the underlayer, such that the metallic buffer layer is formed on the Fe layer.

In various embodiments, the deposition process for forming the metallic buffer layer is performed at a temperature of less than 30° C., and the deposition process for forming the magnetic recording layer is performed at a temperature of about 400° C. The metallic buffer layer and/or the magnetic recording layer may be formed using a deposition process such as sputtering. Additionally, metal of the metallic buffer layer may be removed from the top surface of the perpendicular magnetic recording layer using acetone.

In various implementations, the metallic buffer layer is formed on the underlayer with no intervening layers, and the magnetic recording layer is formed on the metallic buffer layer with no intervening layers. In other embodiments, the metallic buffer layer is formed on the underlayer with no intervening layers, the oxide buffer layer is formed on the metallic buffer layer with no intervening layers, and the magnetic recording layer is formed on the oxide buffer layer with no intervening layers. In yet other embodiments, the Fe layer is formed on the underlayer with no intervening layers, the metallic buffer layer is formed on the Fe layer with no intervening layers, and the magnetic recording layer is formed on the metallic buffer layer with no intervening layers.

In other embodiments, the present invention is directed to film stacks used in the above-described fabrication processes. The film stacks may be intermediate film stacks that are used at a stage in the process prior to final processing, such as prior to removal of the upper metal layer 40, or film stacks that result after removal of the upper metal layer 40. For example, embodiments of the present invention are directed to the film stacks described above and/or shown in FIGS. 3, 4A-B, 5, and 6.

While several embodiments of the invention have been described, it should be apparent that various modifications, alterations, and adaptations to those embodiments may occur to persons skilled in the art with the attainment of some or all of the advantages of the invention. For example, the various materials and dimensions disclosed herein are meant to be illustrative and not limiting. All such modifications, alterations, and adaptations are intended to be covered as defined by the appended claims without departing from the scope and spirit of the present invention.

What is claimed is:

1. A process of fabricating a perpendicular magnetic recording medium, the method comprising:
    forming a metallic buffer layer with a (002) texture on an underlayer, the underlayer having a (001) texture, wherein the forming of the metallic buffer layer comprises forming the metallic buffer layer using a deposition process performed at a temperature below 100° C., wherein the metallic buffer layer comprises Ag;
    after forming the metallic buffer layer, forming an oxide buffer layer on top of the metallic buffer layer, wherein the oxide buffer layer comprises oxide;
    after forming the oxide buffer layer on top of the metallic buffer layer, forming a perpendicular magnetic recording layer on top of the metallic buffer layer, wherein formation of the perpendicular magnetic recording layer comprises forming the magnetic recording layer using a deposition process performed at a temperature between 300° C. and 500° C., wherein the deposition process for forming a perpendicular magnetic recording layer results in a transportation of at least a portion of the Ag from the metallic buffer layer to a top surface of the magnetic recording layer, and wherein the magnetic recording layer comprises:
        magnetic material grains with a $L1_0$ crystalline structure and with a c-axis perpendicular to a plane of the perpendicular magnetic recording layer; and
        oxide grain boundaries for the magnetic material grains, wherein the transportation of at least a portion of the Ag of the metallic buffer layer enhances atomic ordering of the $L1_0$ crystalline structure of the magnetic material grains; and
    after forming the perpendicular magnetic recording layer, removing Ag of the metallic buffer layer from the top surface of the perpendicular magnetic recording layer.

2. The process of claim 1, wherein the magnetic recording layer comprises FePt grains.

3. The process or claim 1, wherein the magnetic recording layer comprises magnetic material grains selected from the group consisting of FePd grains, CoPt grains, and MnAl grains.

4. The process of claim 1, wherein the oxide grain boundaries of the magnetic recording layer comprise $SiO_x$.

5. The process of claim 1, wherein the underlayer comprises MgO having a (001) texture.

6. The process of claim 1, wherein the underlayer comprises RuAl having a (001) texture.

7. The process of claim 1, wherein the oxide buffer layer further comprises Ag.

8. The process of claim 1, wherein the deposition process for forming the metallic buffer layer is performed at a temperature of less than 30° C.

9. The process of claim 8, wherein the deposition process for forming the magnetic recording layer is performed at a temperature of about 400° C.

10. The process of claim 9, wherein:
    forming the metallic buffer layer comprises sputtering the metallic buffer layer on the underlayer; and
    forming the magnetic recording layer comprises sputtering the magnetic recording layer on the metallic buffer layer.

11. The process of claim 10, wherein removing Ag of the metallic buffer layer from the top surface of the perpendicular magnetic recording layer comprises using acetone to remove the metal.

12. The process of claim 1, wherein:
    the metallic buffer layer is formed on the underlayer with no intervening layers; and the magnetic recording layer is formed on the metallic buffer layer with no intervening layers.

13. The process of claim 1, wherein: the metallic buffer layer is formed on the underlayer with no intervening layers; the oxide buffer layer is formed on the metallic buffer layer with no intervening layers; and the magnetic recording layer is formed on the oxide buffer layer with no intervening layers.

14. A process of fabricating a perpendicular magnetic recording medium, the method comprising:
forming a metallic buffer layer with a (002) texture on an underlayer, the underlayer having a (001) texture, wherein the forming of the metallic buffer layer comprises forming the metallic buffer layer using a deposition process performed at a temperature below 100° C., wherein the metallic buffer layer comprises Ag;
after forming the metallic buffer layer, forming an oxide buffer layer on top of the metallic buffer layer, wherein the oxide buffer layer comprises oxide;
after forming the oxide buffer layer on top of the metallic buffer layer, forming a perpendicular magnetic recording layer on top of the metallic buffer layer, wherein formation of the perpendicular magnetic recording layer comprises forming the magnetic recording layer using a deposition process performed at a temperature between 300° C. and 500° C., wherein the deposition process for forming a perpendicular magnetic recording layer results in a transportation of at least a portion of the Ag from the metallic buffer layer to a top surface of the magnetic recording layer, and wherein the magnetic recording layer comprises:
FePt grains with a $L1_0$ crystalline structure and with a c-axis perpendicular to a plane of the perpendicular magnetic recording layer; and
oxide grain boundaries for the FePt grains, wherein the transportation of at least a portion of the A of the metallic buffer layer enhances atomic ordering of the $L1_0$ crystalline structure of the magnetic material grains; and
after forming the perpendicular magnetic recording layer, removing Ag of the metallic buffer layer from a top surface of the perpendicular magnetic recording layer.

15. The process of claim 14, wherein the oxide buffer layer comprises Ag.

* * * * *